US012155386B2

(12) United States Patent
Viti

(10) Patent No.: US 12,155,386 B2
(45) Date of Patent: *Nov. 26, 2024

(54) MULTI-LEVEL PULSER CIRCUIT AND METHOD OF OPERATING A MULTI-LEVEL PULSER CIRCUIT

(71) Applicant: STMICROELECTRONICS S.R.L., Agrate Brianza (IT)

(72) Inventor: Marco Viti, Pregnana Milanese (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/466,562

(22) Filed: Sep. 13, 2023

(65) Prior Publication Data

US 2024/0072775 A1  Feb. 29, 2024

Related U.S. Application Data

(63) Continuation of application No. 17/676,005, filed on Feb. 18, 2022, now Pat. No. 11,791,807.

(30) Foreign Application Priority Data

Feb. 25, 2021  (IT) .......................... 102021000004466

(51) Int. Cl.
    *H03K 3/027*  (2006.01)
    *H03K 19/20*  (2006.01)
(52) U.S. Cl.
    CPC ............ *H03K 3/027* (2013.01); *H03K 19/20* (2013.01)
(58) Field of Classification Search
    CPC .......... H03K 3/027; H03K 19/20; H03K 5/08; H03K 3/57; B06B 1/0215

(Continued)

(56) References Cited

U.S. PATENT DOCUMENTS 8,648,629 B2 *  2/2014  Rossi ........................ G05F 3/02
                                                        327/108
8,710,874 B2 *  4/2014  Rossi ........................ G05F 3/02
                                                        327/170
8,749,099 B2 *  6/2014  Rossi ............. H03K 19/018521
                                                        307/108

(Continued)

FOREIGN PATENT DOCUMENTS

WO        2012077145 A1    6/2012

*Primary Examiner* — Ryan Jager
(74) *Attorney, Agent, or Firm* — Seed IP Law Group LLP

(57) ABSTRACT

A multi-level pulser circuit comprises a set of first input pins for receiving respective positive voltage signals at different voltage levels, a set of second input pins for receiving respective negative voltage signals at different voltage levels, and a reference input pin configured to receive a reference voltage signal intermediate the positive voltage signals and the negative voltage signals. The circuit comprises an output pin configured to supply a pulsed output signal. The circuit further comprises control circuitry configured to selectively couple the output pin to one of the first input pins, the second input pins and the reference input pin to generate the pulsed output signal at the output pin. The control circuitry is further configured to selectively couple at least one of the second input pins and the reference input pin to the output pin during falling transitions of the pulsed output signal between two positive voltage levels, and selectively couple at least one of the first input pins and the reference input pin to the output pin during rising transitions of the pulsed output signal between two negative voltage levels.

19 Claims, 3 Drawing Sheets

(58) Field of Classification Search
USPC .......................................................... 327/291
See application file for complete search history.

(56) References Cited

U.S. PATENT DOCUMENTS

| | | | | |
|---|---|---|---|---|
| 9,323,268 | B2* | 4/2016 | Rossi | H03K 19/09443 |
| 9,455,693 | B2* | 9/2016 | Ghisu | H03K 17/693 |
| 9,778,348 | B1 | 10/2017 | Chen et al. | |
| 10,873,328 | B2* | 12/2020 | Ghisu | B06B 1/0215 |
| 11,791,807 | B2* | 10/2023 | Viti | B06B 1/0215 |
| | | | | 327/291 |
| 2006/0097959 | A1* | 5/2006 | Bezal | G09G 3/296 |
| | | | | 345/60 |
| 2007/0216607 | A1* | 9/2007 | Park | G09G 3/294 |
| | | | | 345/67 |
| 2009/0206676 | A1* | 8/2009 | Chu | B06B 1/0215 |
| | | | | 307/106 |
| 2010/0041997 | A1* | 2/2010 | Amemiya | B06B 1/0215 |
| | | | | 600/459 |
| 2010/0113934 | A1* | 5/2010 | Oguzman | B06B 1/023 |
| | | | | 600/459 |
| 2011/0063011 | A1 | 3/2011 | Barlow | |
| 2012/0268200 | A1* | 10/2012 | Rossi | H03K 19/018521 |
| | | | | 327/574 |
| 2013/0265855 | A1* | 10/2013 | Ghisu | H03K 17/6872 |
| | | | | 367/137 |
| 2022/0271740 | A1* | 8/2022 | Viti | H03K 3/027 |
| 2024/0072775 | A1* | 2/2024 | Viti | H03K 19/20 |

* cited by examiner

MULTI-LEVEL PULSER CIRCUIT AND METHOD OF OPERATING A MULTI-LEVEL PULSER CIRCUIT

BACKGROUND

Technical Field

The description relates to multi-level pulser circuits and related methods of operation.

Description of the Related Art

High-voltage pulsers (or pulser circuits) are conventionally used to drive ultrasound transducers, since they are capable of generating an output signal that can switch from a (high) voltage level to another (high) voltage level at a fast rate with low harmonic distortion. Therefore, pulsers can be used in many fields including medical applications (e.g., in ultrasound scanners for diagnostic sonography), industrial applications (e.g., to carry out ultrasonic non-destructive testing), automotive applications (e.g., in ultrasonic distance sensors for parking assistance systems) and other echolocation applications (e.g., fish finding and the like).

Conventional pulsers allow driving an output node with pulses at different voltage levels, also referred to as "HV" levels in the present description. For instance, a three-level pulser can drive its output node at three different voltage levels (e.g., a positive level +HV, a ground or zero level GND, and a negative level −HV). Similarly, a five-level pulser can drive its output node at five different voltage levels (e.g., a high positive level +HV1, a low positive level +HV0, a ground or zero level GND, a high negative level −HV0, and a low negative level −HV1). Seven-level pulsers or pulsers having even more levels are known in the art, yet they are uncommon.

A conventional multi-level pulser is capable of driving rather easily its output node from a positive voltage level towards a more positive voltage level (i.e., in "upward" or "positive" or "increasing" or "rising" direction between positive levels). Similarly, a conventional multi-level pulser is capable of driving rather easily its output node from a negative voltage level towards a more negative voltage level (i.e., in "downward" or "negative" or "decreasing" or "falling" direction between negative levels). However, a conventional multi-level pulser may fail in rapidly driving its output node from a positive voltage level towards a lower positive voltage level (i.e., it may not be capable of rapidly reaching a target positive voltage with a falling transition), and may fail in rapidly driving its output node from a negative voltage level towards a less negative voltage level (i.e., it may not be capable of rapidly reaching a target negative voltage with a rising transition).

In other terms, conventional multi-level pulsers are capable of rapidly charging the load coupled to the output node (e.g., by injecting a current therein if the load is being positively charged, or by sinking a current therefrom if the load is being negatively charged), but they are not capable of rapidly discharging the load coupled to the output node (e.g., by sinking a current therefrom if a positively charged load is being discharged, or by injecting a current therein if a negatively charged load is being discharged). In the cases above, when the output load has to be discharged following a voltage transition at the output node of a conventional multi-level pulser, the discharge current is substantially supplied by the load itself.

Therefore, there is a need in the art to provide multi-level pulsers having an improved output load driving capability.

BRIEF SUMMARY

One or more embodiments is to contribute in providing such multi-level pulsers having an improved output load driving capability.

According to one or more embodiments, such an object can be achieved by means of a circuit (e.g., a multi-level pulser) having the features set forth in the claims that follow.

One or more embodiments may relate to a corresponding method of operating a multi-level pulser circuit.

The claims are an integral part of the technical teaching provided herein in respect of the embodiments.

In one or more embodiments, a circuit (e.g., a multi-level pulser circuit) may comprise a set of first input pins configured to receive respective positive voltage signals at different voltage levels, a set of second input pins configured to receive respective negative voltage signals at different voltage levels, a reference input pin configured to receive a reference voltage signal intermediate the positive voltage signals and the negative voltage signals, and an output pin configured to supply a pulsed output signal. The circuit may further comprise control circuitry configured to selectively couple the output pin to one of the first input pins, the second input pins and the reference input pin to generate the pulsed output signal at the output pin. The control circuitry may be further configured to selectively couple at least one of the second input pins and the reference input pin to the output pin during falling transitions of the pulsed output signal between two positive voltage levels, and to selectively couple at least one of the first input pins and the reference input pin to the output pin during rising transitions of the pulsed output signal between two negative voltage levels.

One or more embodiments may thus facilitate driving the output node of a multi-level pulser to any voltage level available within the overall supply range, independently from the characteristics of the output load.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, to provide an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for brevity.

Figure 1:
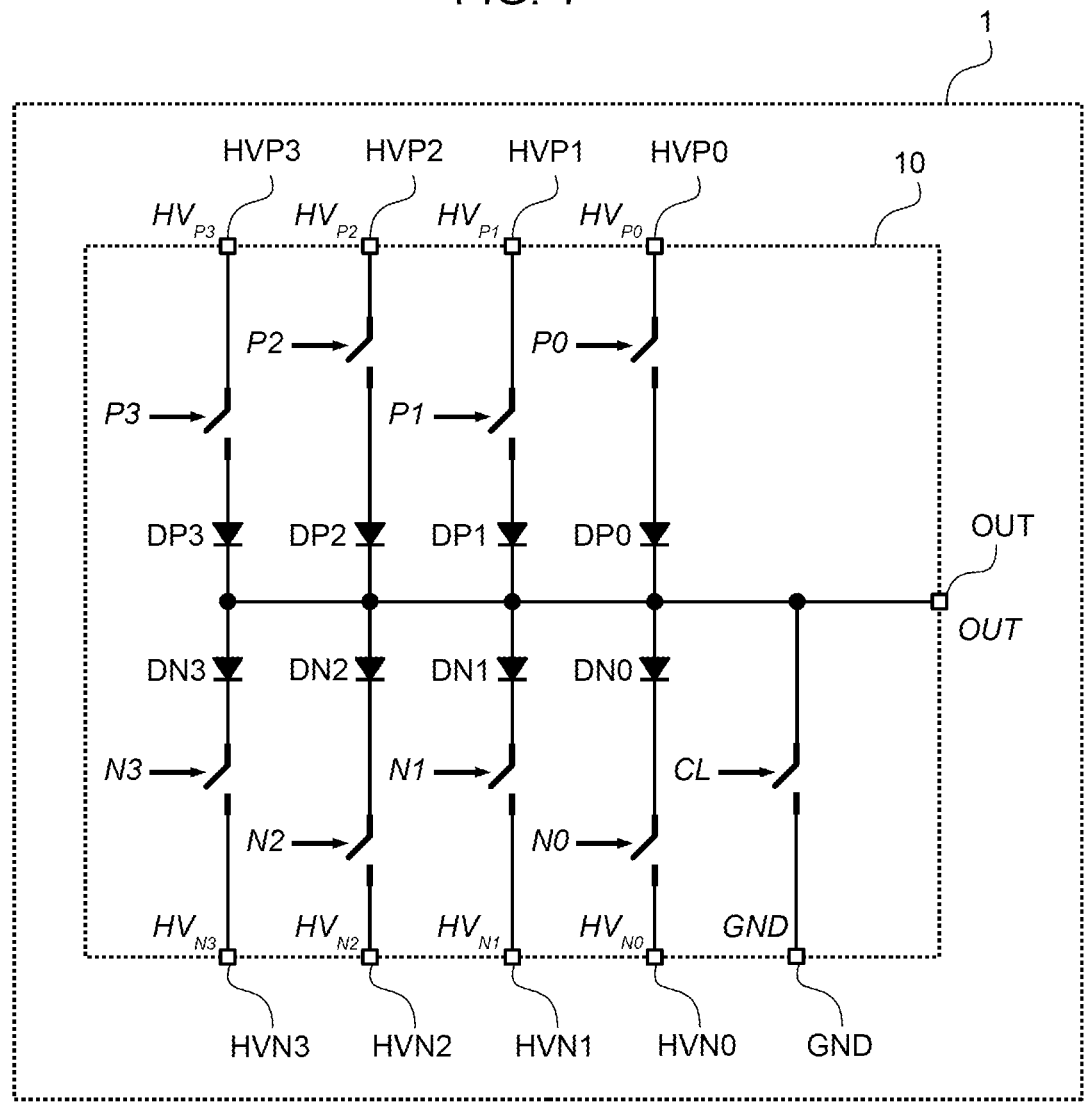
FIG. 1 is a circuit block diagram exemplary of the architecture of a high-voltage channel of a nine-level pulser circuit.

By way of introduction to the detailed description of exemplary embodiments, reference may first be made to FIG. 1, which is a circuit block diagram exemplary of the architecture of a high-voltage channel 10 of a nine-level pulser circuit 1.

As exemplified in FIG. 1, the high-voltage channel 10 comprises a set of input pins HVP0, HVP1, HVP2, HVP3 configured to receive positive voltage signals at different levels. For instance, the input pin HVP0 may receive a certain positive voltage signal $HV_{P0}$, the input pin HVP1 may receive a positive voltage signal $HV_{P1}$ higher than $HV_{P0}$, the input pin HVP2 may receive a positive voltage signal $HV_{P2}$ higher than $HV_{P1}$, and the input pin HVP3 may receive a positive voltage signal $HV_{P3}$ higher than $HV_{P2}$. The high-voltage channel 10 also comprises a set of input pins HVN0, HVN1, HVN2, HVN3 configured to receive negative voltage signals at different levels. For instance, the input pin HVN0 may receive a certain negative voltage signal $HV_{N0}$, the input pin HVN1 may receive a negative voltage signal $HV_{N1}$ lower (i.e., more negative) than $HV_{N0}$, the input pin HVN2 may receive a negative voltage signal $HV_{N2}$ lower than $HV_{N1}$, and the input pin HVN3 may receive a negative voltage signal $HV_{N3}$ lower than $HV_{N2}$. The high-voltage channel 10 also comprises an input pin GND configured to receive a reference or zero voltage signal GND which is intermediate between the positive voltage signal $HV_{P0}$ and the negative voltage signal $HV_{N0}$.

As exemplified in FIG. 1, the high-voltage channel 10 comprises an output pin OUT configured to supply a pulsed output signal OUT that can switch between the values of the input signals received at the input pins. To that purpose, each of the input pins of the high-voltage channel 10 is selectively couplable to the output pin OUT by means of a respective current path comprising a series arrangement of an electronic switch and, optionally, a diode.

Figure 2:
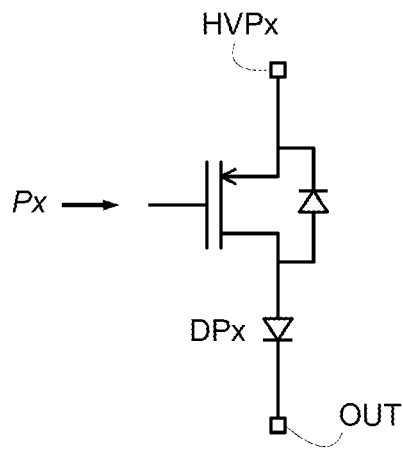
FIGS. 2 and 3 are circuit diagrams exemplary of possible implementation details of a high-voltage channel of a unidirectional pulser circuit.

For instance, each "positive" input pin HVPx (with x=0, 1, 2, or 3) is couplable to the output pin OUT by means of a respective MOS transistor connected in series to a diode DPx (with x=0, 1, 2, or 3), the diode being arranged to be normally conductive from the respective positive input pin towards the output pin. As exemplified in FIG. 2, the MOS transistor may be a p-channel transistor having the source terminal coupled to the positive input pin HVPx, the gate terminal configured to receive a respective control signal Px (with x=0, 1, 2, or 3), and the drain terminal coupled to the anode of the diode DPx. The cathode of the diode DPx may be coupled to the output pin OUT.

Figure 3:
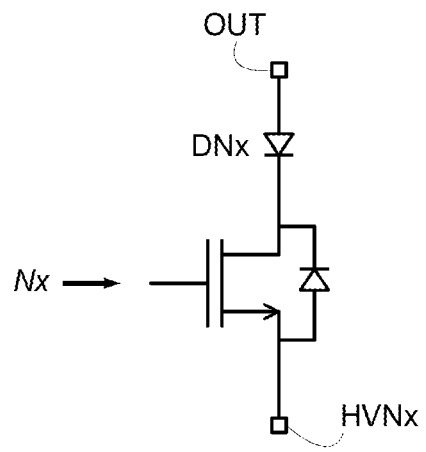

For instance, each "negative" input pin HVNx (with x=0, 1, 2, or 3) is couplable to the output pin OUT by means of a respective MOS transistor connected in series to a diode DNx (with x=0, 1, 2, or 3), the diode being arranged to be normally conductive from the output pin towards the respective negative input pin. As exemplified in FIG. 3, the MOS transistor may be an n-channel transistor having the source terminal coupled to the negative input pin HVNx, the gate terminal configured to receive a respective control signal Nx (with x=0, 1, 2, or 3), and the drain terminal coupled to the cathode of the diode DNx. The anode of the diode DNx may be coupled to the output pin OUT.

For instance, the "reference" input pin GND is couplable to the output node OUT by means of any structure allowing current to flow in both directions, configured to receive a respective (clamping) control signal CL, to enable or disable the flow of current. Once enabled, the current will flow from/to GND to/from VOUT. In brief, the architecture of the high-voltage channel 10 exemplified in FIG. 1 can include four half-bridge arrangements (here numbered 0 to 3) supplied by four different voltage rails (i.e., eight different voltage levels) plus a clamp circuit configured to selectively clamp the output voltage OUT to the reference or zero value GND. The connection between Vout and GND is bidirectional and a diode is not included. Each unidirectional current path between the output pin OUT and an input supply pin comprises an electronic switch (e.g., a MOS transistor of the p-channel type or the n-channel type) and a diode arranged in series.

The pulser circuit 1 may further comprise a control circuit (not visible in the Figures annexed herein) which is configured to generate the control signals P0, . . . , P3 and N0, . . . , N3 and CL for controlling the electronic switches (e.g., transistors) in each branch of the half-bridges, so as to generate a pulsed output signal OUT.

Figure 4:
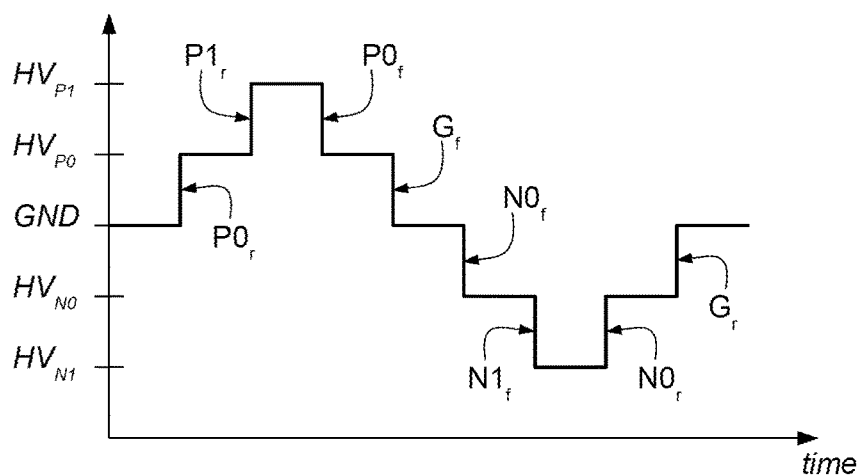
FIG. 4 is a signal diagram exemplary of the time evolution of the output signal of a pulser circuit according to one or more embodiments of the present description.
Figure 5:
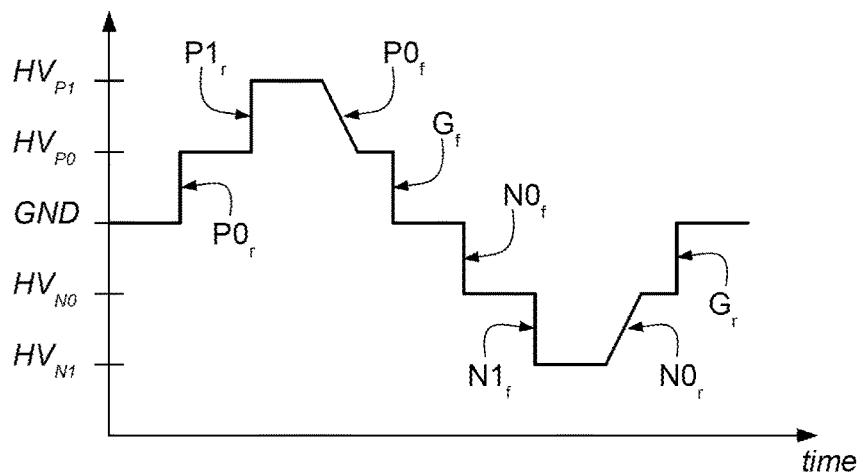
FIG. 5 is a signal diagram exemplary of the time evolution of the output signal of a conventional unidirectional pulser circuit.

As anticipated, a conventional circuit arrangement as exemplified in FIG. 1 may suffer from a reduced capability of driving the output pin OUT during certain voltage transitions, in particular falling transitions between positive voltage levels and rising transitions between negative voltage levels, as exemplified by a comparison of FIGS. 4 and 5. FIG. 4 is a signal diagram exemplary of the time evolution of the output signal OUT in a best case (e.g., if the pulser were able to drive the output pin equally at any of the available voltage levels), while FIG. 5 is a signal diagram exemplary of the time evolution of the output signal OUT in a conventional unidirectional pulser. In FIGS. 4 and 5, transitions between different voltage levels are indicated with references that indicate the final voltage level after the transition (e.g., P0 for $HV_{P0}$, P1 for $HV_{P1}$, N0 for $HV_{N0}$, N1 for $HV_{N1}$, G for GND) with a subscript "r" if the transition is a rising (upward) transition or a subscript "f" if the transition is a falling (downward) transition.

As exemplified in FIG. 5, in a conventional unidirectional pulser the transitions of the output signal OUT may be managed as follows:
  all the transitions towards the ground voltage level GND (i.e., $G_f$ and $G_r$) are carried out by turning on the clamping transistor coupled to the input pin GND; the clamping transistor is capable of both sinking a current from the output pin OUT and sourcing a current to the output pin OUT, so that the transitions towards the ground voltage level GND may not suffer any slowing of edge slope;

the rising transition $P0_r$ towards level $HV_{P0}$ is carried out by turning on the transistor coupled to the input pin HVP0; the respective current path is capable of sourcing a current to the output pin OUT, so that the rising transition $P0_r$ may not suffer any slowing of edge slope;

the rising transition $P1_r$ towards level $HV_{P1}$ is carried out by turning on the transistor coupled to the input pin HVP1; the respective current path is capable of sourcing a current to the output pin OUT, so that the rising transition $P1_r$ may not suffer any slowing of edge slope;

the falling transition $P0_f$ towards level $HV_{P0}$ is carried out by turning on the transistor coupled to the input pin HVP0; the respective current path is not capable of sinking a current from the output pin OUT, so that the falling transition $P0_f$ may suffer a slowing of edge slope, with the slope of the output signal OUT depending on the output load;

the falling transition $N0_f$ towards level $HV_{N0}$ is carried out by turning on the transistor coupled to the input pin HVN0; the respective current path is capable of sinking a current from the output pin OUT, so that the falling transition $N0_f$ may not suffer any slowing of edge slope;

the falling transition $N1_f$ towards level $HV_{N1}$ is carried out by turning on the transistor coupled to the input pin HVN1; the respective current path is capable of sinking a current from the output pin OUT, so that the falling transition $N1_f$ may not suffer any slowing of edge slope; and the rising transition $N0_r$ towards level $HV_{N0}$ is carried out by turning on the transistor coupled to the input pin HVN0; the respective current path is not capable of sourcing a current to the output pin OUT, so that the rising transition $N0_r$ may suffer a slowing of edge slope, with the slope of the output signal OUT depending on the output load.

Those of skill in the art will understand that FIGS. 4 and 5 refer to the voltage transitions available in a five-level pulser for the sake of brevity and simplicity of illustration only. A similar behavior can be observed in seven-level pulsers, nine-level pulsers or any other pulser having a higher number of voltage levels, with the number of transitions increasing accordingly.

It is noted that the shortcomings of a conventional unidirectional pulser discussed with reference to FIG. 5 may be at least partially remedied by providing the capability of both sinking and sourcing a current to each half-bridge branch, i.e., to each current path between the output pin OUT and the input pins HVPx and HVNx, implementing an active (also called true or bidirectional) multi-level pulser. Possibly, the half-bridge which provides the highest voltage and the lowest voltage (i.e., HVP3 and HVN3 in the example of FIG. 1) may not use such a bidirectional current capability, insofar as those current paths can be activated in one direction only (i.e., HVP3 may be activated in a rising transition only, and HVN3 may be activated in a falling transition only).

Figure 6:
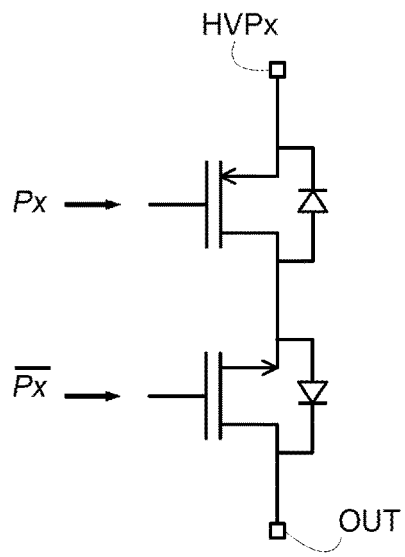
FIGS. 6 and 7 are circuit diagrams exemplary of possible implementation details of a high-voltage channel of a bidirectional pulser circuit.

FIG. 6 is a circuit diagram exemplary of a bidirectional current path as possibly provided in a positive half-bridge branch (i.e., between a positive input pin HVPx and the output pin OUT) of a bidirectional pulser, comprising a series arrangement of a p-channel MOS transistor and an n-channel MOS transistor. The p-channel MOS transistor may have the source terminal coupled to the positive input pin HVPx, the gate terminal configured to receive the respective control signal Px (with x=0, 1, 2, or 3), and the drain terminal coupled to the source terminal of the n-channel MOS transistor. The n-channel MOS transistor may have the gate terminal configured to receive the control signal $\overline{Px}$ and the drain terminal coupled to the output pin OUT.

Figure 7:
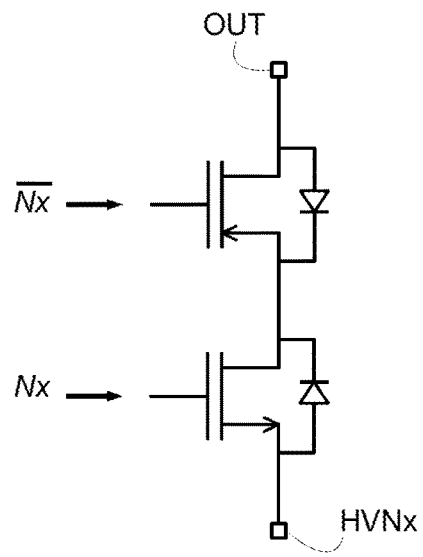

FIG. 7 is a circuit diagram exemplary of a bidirectional current path as possibly provided in a negative half-bridge branch (i.e., between the output pin OUT and a negative input pin HVNx) of a bidirectional pulser, comprising a series arrangement of an n-channel MOS transistor and a p-channel MOS transistor. The n-channel MOS transistor may have the source terminal coupled to the negative input pin HVNx, the gate terminal configured to receive the respective control signal Nx (with x=0, 1, 2, or 3), and the drain terminal coupled to the source terminal of the p-channel MOS transistor. The p-channel MOS transistor may have the gate terminal configured to receive the control signal $\overline{Nx}$ and the drain terminal coupled to the output pin OUT.

It is noted that providing bidirectional half-bridge branches in a multi-level pulser may turn out to increase the design complexity, reduce the reliability, and increase the size and/or cost of the pulser circuit, insofar as additional silicon area is occupied to implement the extra MOS transistors which provide the current sink and source capability to each half-bridge branch.

One or more embodiments may provide a pulser circuit with improved output load driving capability, in particular with reference to falling transitions between positive voltage levels and rising transitions between negative voltage levels, resorting to a different use (e.g., a different control sequence) of the half-bridge branches as available in a unidirectional pulser, without implement additional MOS transistors.

In particular, again with reference to FIGS. 4 and 5, the timing of a falling transition between two positive voltage levels ($P0_f$ in the present example) can be improved by turning on, simultaneously with the half-bridge branch supplied by the corresponding positive voltage level ($HV_{P0}$ in the present example), also the clamping half-bridge branch which couples the output node OUT to the ground voltage level GND. Therefore, despite the inability of the positive half-bridge branch to sink a current from the output node OUT, the output voltage signal OUT may rapidly decrease insofar as a current is sunk from the output node OUT via the clamping branch coupled to the reference pin GND.

It is noted that, when operating the multi-level pulser as described above, the positive half-bridge branch supplied by the positive voltage level ($HV_{P0}$ in the present example) may start sourcing a current as a result of the output voltage signal OUT decreasing below the target voltage level ($HV_{P0}$ in the present example). Therefore, in one or more embodiments the clamping half-bridge branch may be turned off when the positive half-bridge branch starts to source a current, so as to avoid direct conduction between the positive voltage rail (HVP0 in the present example) and the reference pin GND, with a waste of current.

Similarly, again with reference to FIGS. 4 and 5, the timing of a rising transition between two negative voltage levels ($N0_r$ in the present example) can be improved by turning on, simultaneously with the half-bridge branch supplied by the corresponding negative voltage level ($HV_{N0}$ in the present example), also the clamping half-bridge branch which couples the output node OUT to the ground voltage level GND. Therefore, despite the inability of the negative half-bridge branch to source a current to the output node OUT, the output voltage signal OUT may rapidly increase insofar as a current is sourced to the output node OUT via the clamping branch coupled to the reference pin GND.

It is noted that, when operating the multi-level pulser as described above, the negative half-bridge branch supplied by the negative voltage level ($HV_{N0}$ in the present example) may start sinking a current as a result of the output voltage signal OUT increasing above the target voltage level ($HV_{N0}$ in the present example). Therefore, in one or more embodiments the clamping half-bridge branch may be turned off when the negative half-bridge branch starts to sink a current, so as to avoid direct conduction between the negative voltage rail (HVN0 in the present example) and the reference pin GND, with a waste of current.

The clamping half-bridge branch may be controlled according to different strategies in order to avoid direct conduction between the supply input pins and the ground pin GND.

For instance, in one or more embodiments the clamping half-bridge branch can be turned off as a result of a current being sensed through the other half-bridge branch which is simultaneously activated (e.g., as soon as a current is sensed), in a closed loop control configuration. To this purpose, a current sensing element may be provided in each half-bridge branch of the pulser circuit, possibly with the exception of the half-bridge branches which are connected to the most positive voltage level and to the most negative voltage level. For instance, the diodes DPx and DNx provided in each half-bridge current path may be used as current sensing elements, as exemplified in FIG. 8, which is a circuit block diagram exemplary of a high-voltage channel 80 of a five-level pulser circuit 8 according to one or more embodiments.

Figure 8:
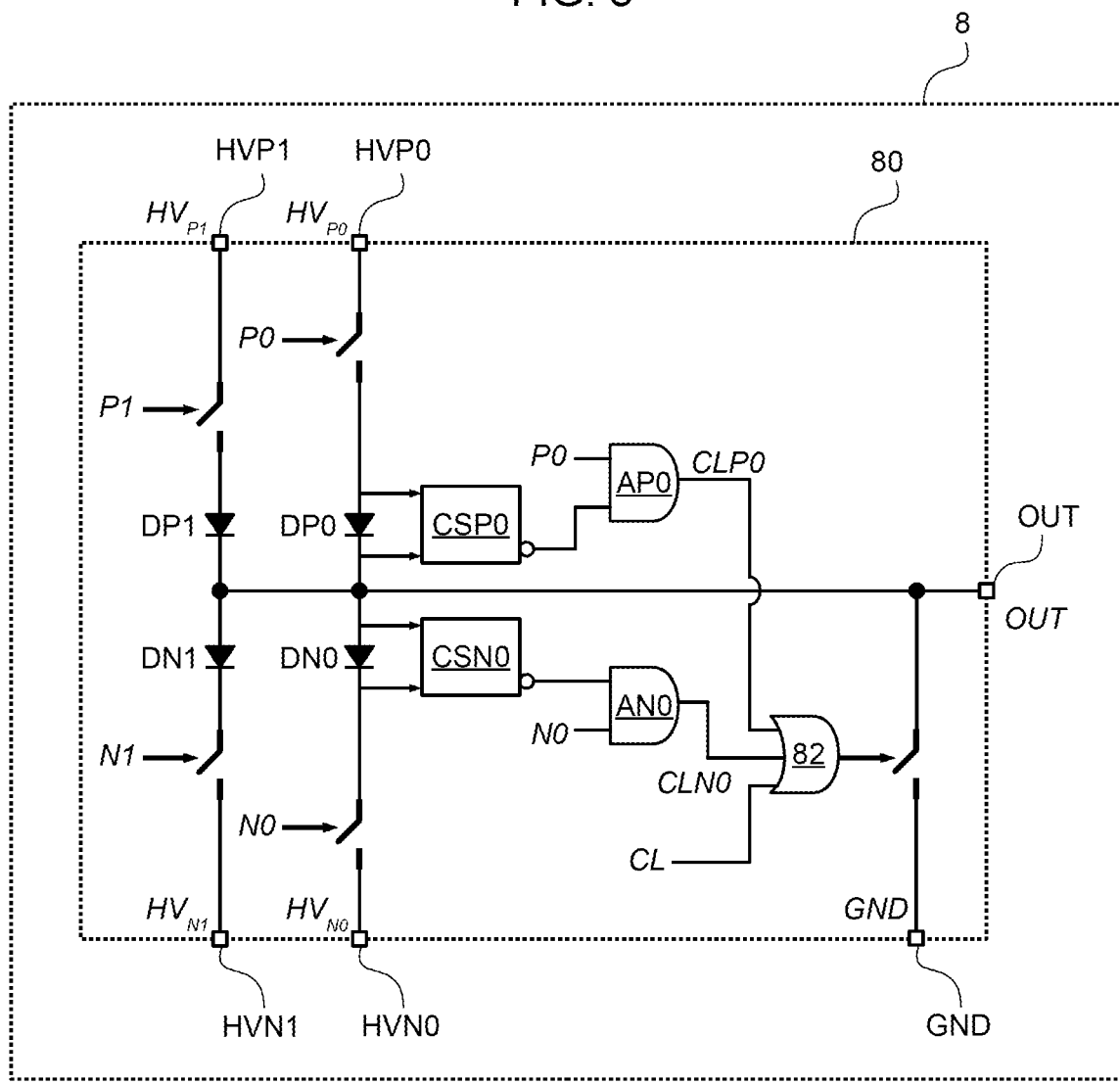
FIG. 8 is a circuit block diagram exemplary of the architecture of a high-voltage channel of a five-level pulser circuit according to one or more embodiments of the present description.

As exemplified in FIG. 8, the pulser circuit may comprise a current sensing circuit CSP0 configured to sense the current flowing through the diode DP0 (e.g., by measuring the voltage across the diode and comparing it to a threshold value) and to assert a respective output signal as long as the sensed current is (approximately) equal to zero. An AND logic gate AP0 may receive the output signal from the current sensing circuit CSP0 as a first input and the control signal P0 as a second input, thereby generating a respective output signal CLP0 which is indicative of the fact that the output voltage level $HV_{P0}$ is currently requested and no current is flowing in the corresponding half-bridge branch (i.e., no current is flowing between the input pin HVP0 and the output pin OUT).

Similarly, the pulser circuit may comprise a current sensing circuit CSN0 configured to sense the current flowing through the diode DN0 (e.g., by measuring the voltage across the diode and comparing it to a threshold value) and to assert a respective output signal as long as the sensed current is (approximately) equal to zero. An AND logic gate AN0 may receive the output signal from the current sensing circuit CSN0 as a first input and the control signal N0 as a second input, thereby generating a respective output signal CLN0 which is indicative of the fact that the output voltage level $HV_{N0}$ is currently requested and no current is flowing in the corresponding half-bridge branch (i.e., no current is flowing between the input pin HVN0 and the output pin OUT).

As exemplified in FIG. 8, an OR logic gate 82 may receive the input signals CLP0, CLN0 and CL so that the clamping branch of the high-voltage channel 80 is activated (e.g., brought to a conductive state by turning on the corresponding transistor) when the output voltage level GND is requested, or the output voltage level $HV_{P0}$ is requested and no current is flowing between the input pin HVP0 and the output pin OUT, or the output voltage level $HV_{N0}$ is requested and no current is flowing between the input pin HVN0 and the output pin OUT.

Those of skill in the art will understand that, in the case of a higher number of voltage levels (e.g., seven or nine voltage levels), a current may be sensed in each of the relevant half-bridge branches and respective activation signals may be combined in the OR logic gate. For instance, in a seven-level pulser the OR logic gate may receive five input signals CLP1, CLP0, CL, CLN0, CLN1. Similarly, in a nine-level pulser the OR logic gate may receive seven input signals CLP2, CLP1, CLP0, CL, CLN0, CLN1, CLN2.

Also, those of skill in the art will understand that the current sensing circuitry (e.g., CSP0 and CSN0) and/or the logic circuitry (e.g., AP0, AN0, 82) may be comprised in a control circuit of the pulser 8, not visible in the Figures annexed herein for the sake of simplicity of illustration only.

Additionally or alternatively, in one or more embodiments the clamping half-bridge branch can be turned off upon expiry of a certain time period (optionally, a programmable time period), in an open loop control configuration. Such embodiments may be advantageous insofar as the open loop control may not rely on the use of additional circuitry such as the current sensing circuits CSP0, CSN0 and the logic circuits AP0, AN0, 82, thereby reducing the design complexity and the cost of the pulser circuit. Instead, the control circuit of the pulser 8 may be programmed to activate the clamping half-bridge branch for a certain period of time during certain output voltage transitions (e.g., during the falling transitions between positive voltage levels and the rising transitions between negative voltage levels).

Additionally or alternatively, one or more embodiments may rely on a combination of the open loop control strategy and the closed loop control strategy. For instance, the clamping half-bridge branch may be activated for a certain time period (e.g., fixed or programmable), then it may be deactivated while checking the amount of current flowing in the other half-bridge branch concurrently activated, and possibly it may be activated again for a certain time period, with the possibility of repeating the activation/deactivation cycle of the clamping half-bridge branch plural times as a function of the current sensed in the other half-bridge branch which is concurrently activated.

Additionally or alternatively, one or more embodiments may achieve improved output node driving capability by activating, during certain output voltage transitions, one or more of the "complementary" half-bridge branches, in addition or as an alternative to activating the clamping half-bridge branch.

For instance, in the case of a falling transition between two positive output voltage levels (e.g., see again transition $P0_f$ in FIGS. 4 and 5), one or more of the negative half-bridge branches may activated, thereby coupling the output node OUT to one or more of the negative input pins (e.g., HVN0 and/or HVN1, in the case of a five-level pulser). Similarly, in the case of a rising transition between two negative output voltage levels (e.g., see again transition N0, in FIGS. 4 and 5), one or more of the positive half-bridge branches may activated, thereby coupling the output node OUT to one or more of the positive input pins (e.g., HVP0 and/or HVP1, in the case of a five-level pulser).

In one or more embodiments, the activation of the "complementary" half-bridge branches in addition or as an alternative to the activation of the clamping half-bridge branch may rely on a closed loop control configuration, an open loop control configuration, or any combination thereof, as discussed previously. For instance, an exemplary open loop control strategy for managing the falling transition $P0_f$ may comprise coupling the output node OUT to the input negative pin HVN0 for a short time period (e.g., a few nanoseconds), then coupling the output node OUT to the ground pin GND for another time period (e.g., again a few nanoseconds), then finally deactivating all the "auxiliary" half-bridge branches and leaving the output node OUT coupled to the input positive pin HVP0.

Those of skill in the art will understand that FIG. 8 refers to a five-level pulser by way of example only, for the sake of simplicity of illustration. One or more embodiments may relate to a pulser circuit having a different number of levels (e.g., seven, nine or more) implementing one or more of the control strategies (e.g., open loop, closed loop and/or combinations thereof) previously disclosed.

Therefore, one or more embodiments may provide one or more of the following advantages:
- with respect to conventional unidirectional pulsers, one or more embodiments may result in a more robust reproduction of the target output voltage profile, independently from the output load, thereby facilitating obtaining a better quality and better performance of the final application; and
- with respect to conventional bidirectional pulsers, one or more embodiments may result in lower design complexity, improved reliability, smaller circuit size and lower cost.

As exemplified herein, a circuit (e.g., a multi-level pulser, 8) may comprise:
- a set of first (e.g., "positive") input pins (e.g., HVP0, HVP1) configured to receive respective positive voltage signals (e.g., $HV_{P0}$, $HV_{P1}$) at different voltage levels;
- a set of second (e.g., "negative") input pins (e.g., HVN0, HVN1) configured to receive respective negative voltage signals (e.g., $HV_{N0}$, $HV_{N1}$) at different voltage levels;
- a reference input pin (e.g., GND) configured to receive a reference voltage signal (e.g., GND) intermediate the positive voltage signals and the negative voltage signals;
- an output pin (e.g., OUT) configured to supply a pulsed output signal (e.g., OUT); and
- control circuitry configured to selectively (e.g., P0, P1, N0, N1, CL) couple the output pin to one of the first input pins, the second input pins and the reference input pin to generate the pulsed output signal at the output pin.

As exemplified herein, the control circuitry may be further configured to:
- selectively couple at least one of the second input pins and the reference input pin to the output pin during falling transitions (e.g., P0$_f$) of the pulsed output signal between two positive voltage levels; and
- selectively couple at least one of the first input pins and the reference input pin to the output pin during rising transitions (e.g., N0$_r$) of the pulsed output signal between two negative voltage levels.

As exemplified herein, the control circuitry may be configured to:
- selectively couple the reference input pin to the output pin during falling transitions of the pulsed output signal between two positive voltage levels; and
- selectively couple the reference input pin to the output pin during rising transitions of the pulsed output signal between two negative voltage levels.

As exemplified herein, the control circuitry may be configured to:
- during falling transitions of the pulsed output signal between two positive voltage levels, sense a current flowing between the output pin and the first input pin (e.g., HVP0) currently coupled thereto, and decouple the output pin from the second input pins and the reference input pin in response to the sensed current flowing between the output pin and the first input pin currently coupled thereto being higher than a first threshold value (e.g., zero); and
- during rising transitions of the pulsed output signal between two negative voltage levels, sense a current flowing between the output pin and the second input pin (e.g., HVN0) currently coupled thereto, and decouple the output pin from the first input pins and the reference input pin in response to the sensed current flowing between the output pin and the second input pin currently coupled thereto being higher than a second threshold value (e.g., zero).

As exemplified herein, the control circuitry may be further configured to:
- during falling transitions of the pulsed output signal between two positive voltage levels, cyclically couple and decouple the at least one of the second input pins and the reference input pin to the output pin as long as the sensed current flowing between the output pin and the first input pin currently coupled thereto is lower than the first threshold value; and
- during rising transitions of the pulsed output signal between two negative voltage levels, cyclically couple and decouple the at least one of the first input pins and the reference input pin to the output pin as long as the sensed current flowing between the output pin and the second input pin currently coupled thereto is lower than the second threshold value.

As exemplified herein, the control circuitry may be configured to:
- during falling transitions of the pulsed output signal between two positive voltage levels, decouple the output pin from the second input pins and the reference input pin upon expiry of a first time period; and
- during rising transitions of the pulsed output signal between two negative voltage levels, decouple the output pin from the first input pins and the reference input pin upon expiry of a second time period.

As exemplified herein, the control circuitry may comprise a programmable memory configured to store a value of the first time period and a value of the second time period.

As exemplified herein, the circuit may comprise:
- a set of p-channel MOS transistors providing respective current paths between each of the first input pins and the output pin, each p-channel MOS transistor being selectively activatable to couple the output pin to a respective one of the first input pins; and
- a set of n-channel MOS transistors providing respective current paths between each of the second input pins and the output pin, each n-channel MOS transistor being selectively activatable to couple the output pin to a respective one of the second input pins.

As exemplified herein, each current path between the output pin and the first input pins may not comprise an n-channel MOS transistor, and each current path between the output pin and the first input pins may not comprise a p-channel MOS transistor.

As exemplified herein, a method of operating a circuit according to one or more embodiments may comprise:
- receiving respective positive voltage signals having different voltage levels at the first input pins;

receiving respective negative voltage signals having different voltage levels at the second input pins;

receiving a reference voltage signal intermediate the positive voltage signals and the negative voltage signals at the reference input pin;

selectively coupling the output pin to one of the first input pins, the second input pins and the reference input pin to generate a pulsed output signal at the output pin;

selectively coupling at least one of the second input pins and the reference input pin to the output pin during falling transitions of the pulsed output signal between two positive voltage levels; and selectively coupling at least one of the first input pins and the reference input pin to the output pin during rising transitions of the pulsed output signal between two negative voltage levels.

Without prejudice to the underlying principles, the details and embodiments may vary, even significantly, with respect to what has been described by way of example only, without departing from the extent of protection.

A circuit (8) may be summarized as including a set of first input pins (HVP0, HVP1) configured to receive respective positive voltage signals (HVP0, HVP1) at different voltage levels, a set of second input pins (HVN0, HVN1) configured to receive respective negative voltage signals (HVN0, HVN1) at different voltage levels, a reference input pin (GND) configured to receive a reference voltage signal (GND) intermediate said positive voltage signals (HVP0, HVP1) and said negative voltage signals (HVN0, HVN1), an output pin (OUT) configured to supply a pulsed output signal (OUT), and control circuitry configured to selectively (P0, P1, N0, N1, CL) couple said output pin (OUT) to one of said first input pins (HVP0, HVP1), said second input pins (HVN0, HVN1) and said reference input pin (GND) to generate said pulsed output signal (OUT) at said output pin (OUT), wherein the control circuitry is further configured to selectively couple at least one of said second input pins (HVN0, HVN1) and said reference input pin (GND) to said output pin (OUT) during falling transitions (P0f) of said pulsed output signal (OUT) between two positive voltage levels, and selectively couple at least one of said first input pins (HVP0, HVP1) and said reference input pin (GND) to said output pin (OUT) during rising transitions (N0r) of said pulsed output signal (OUT) between two negative voltage levels.

The control circuitry may be configured to selectively couple said reference input pin (GND) to said output pin (OUT) during falling transitions (P0f) of said pulsed output signal (OUT) between two positive voltage levels, and selectively couple said reference input pin (GND) to said output pin (OUT) during rising transitions (N0r) of said pulsed output signal (OUT) between two negative voltage levels.

The control circuitry may be configured to: during falling transitions (P0f) of said pulsed output signal (OUT) between two positive voltage levels, sense a current flowing between said output pin (OUT) and the first input pin (HVP0) currently coupled thereto, and decouple said output pin (OUT) from said second input pins (HVN0, HVN1) and said reference input pin (GND) in response to said sensed current flowing between said output pin (OUT) and the first input pin (HVP0) currently coupled thereto being higher than a first threshold value; and during rising transitions (N0r) of said pulsed output signal (OUT) between two negative voltage levels, sense a current flowing between said output pin (OUT) and the second input pin (HVN0) currently coupled thereto, and decouple said output pin (OUT) from said first input pins (HVN0, HVN1) and said reference input pin (GND) in response to said sensed current flowing between said output pin (OUT) and the second input pin (HVN0) currently coupled thereto being higher than a second threshold value.

The control circuitry may be further configured to: during falling transitions (P0f) of said pulsed output signal (OUT) between two positive voltage levels, cyclically couple and decouple said at least one of said second input pins (HVN0, HVN1) and said reference input pin (GND) to said output pin (OUT) as long as said sensed current flowing between said output pin (OUT) and the first input pin (HVP0) currently coupled thereto is lower than said first threshold value; and during rising transitions (N0r) of said pulsed output signal (OUT) between two negative voltage levels, cyclically couple and decouple said at least one of said first input pins (HVP0, HVP1) and said reference input pin (GND) to said output pin (OUT) as long as said sensed current flowing between said output pin (OUT) and the second input pin (HVN0) currently coupled thereto is lower than said second threshold value.

The control circuitry may be configured to: during falling transitions (P0f) of said pulsed output signal (OUT) between two positive voltage levels, decouple said output pin (OUT) from said second input pins (HVN0, HVN1) and said reference input pin (GND) upon expiry of a first time period; and during rising transitions (N0r) of said pulsed output signal (OUT) between two negative voltage levels, decouple said output pin (OUT) from said first input pins (HVN0, HVN1) and said reference input pin (GND) upon expiry of a second time period.

Said control circuitry may include a programmable memory configured to store a value of said first time period and a value of said second time period.

The circuit (8) may include: a set of p-channel MOS transistors providing respective current paths between each of said first input pins (HVP0, HVP1) and said output pin (OUT), each p-channel MOS transistor being selectively activatable (P0, P1) to couple said output pin (OUT) to a respective one of said first input pins (HVP0, HVP1); and a set of n-channel MOS transistors providing respective current paths between each of said second input pins (HVN0, HVN1) and said output pin (OUT), each n-channel MOS transistor being selectively activatable (N0, N1) to couple said output pin (OUT) to a respective one of said second input pins (HVN0, HVN1), wherein each current path between said output pin (OUT) and said first input pins (HVP0, HVP1) does not include an n-channel MOS transistor, and wherein each current path between said output pin (OUT) and said second input pins (HVN0, HVN1) does not include a p-channel MOS transistor.

A method of operating a circuit (8), wherein the circuit (8) may be summarized as including a set of first input pins (HVP0, HVP1) configured to receive respective positive voltage signals (HVP0, HVP1) at different voltage levels, a set of second input pins (HVN0, HVN1) configured to receive respective negative voltage signals (HVN0, HVN1) at different voltage levels, a reference input pin (GND) configured to receive a reference voltage signal (GND) intermediate said positive voltage signals (HVP0, HVP1) and said negative voltage signals (HVN0, HVN1), and an output pin (OUT) configured to supply a pulsed output signal (OUT); the method may be summarized as including receiving respective positive voltage signals (HVP0, HVP1) having different voltage levels at said first input pins (HVP0, HVP1), receiving respective negative voltage signals (HVN0, HVN1) having different voltage levels at said second input pins (HVN0, HVN1), receiving a reference voltage signal (GND) intermediate said positive voltage signals (HVP0, HVP1) and said negative voltage signals (HVN0, HVN1) at said reference input pin (GND), selectively (P0, P1, N0, N1, CL) coupling said output pin (OUT) to one of said first input pins (HVP0, HVP1), said second input pins (HVN0, HVN1) and said reference input pin (GND) to generate a pulsed output signal (OUT) at said output pin (OUT), selectively coupling at least one of said second input pins (HVN0, HVN1) and said reference input pin (GND) to said output pin (OUT) during falling transitions (P0f) of said pulsed output signal (OUT) between two positive voltage levels, and selectively coupling at least one of said first input pins (HVP0, HVP1) and said reference input pin (GND) to said output pin (OUT) during rising transitions (N0r) of said pulsed output signal (OUT) between two negative voltage levels.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a set of first input pins configured to receive respective positive voltage signals at different voltage levels;
a set of second input pins configured to receive respective negative voltage signals at different voltage levels;
a reference input pin configured to receive a reference voltage signal intermediate the positive voltage signals and the negative voltage signals;
an output pin configured to supply a pulsed output signal; and
control circuitry configured to:
selectively couple the output pin to one of the first input pins, the second input pins and the reference input pin to generate the pulsed output signal at the output pin;
selectively couple at least one of the second input pins and the reference input pin to the output pin during falling transitions of the pulsed output signal between two positive voltage levels;
selectively couple at least one of the first input pins and the reference input pin to the output pin during rising transitions of the pulsed output signal between two negative voltage levels;
sense a first current flowing through the first set of input pins; and
sense a second current flowing through the second set of input pins.

2. The circuit of claim 1, wherein the control circuitry is configured to sense the first current and the second current periodically over a period.

3. The circuit of claim 1, wherein the control circuitry is configured to sense the first current during a first period when at least one of the second input pins is coupled to the output pin, and
the control circuitry is configured to sense the second current during a second period when at least one of the first input pins is coupled to the output pin.

4. The circuit of claim 3, wherein the first period has the same duration as the second period.

5. The circuit of claim 3, wherein the control circuitry is configured to sense the first current more than one time during the first period and the control circuitry is configured to sense the second current more than one time during the second period.

6. A method, comprising:
receiving respective positive voltage signals having different voltage levels at first input pins;
receiving respective negative voltage signals having different voltage levels at second input pins;
receiving a reference voltage signal intermediate to the positive voltage signals and the negative voltage signals at a reference input pin;
generating a pulsed output signal at an output pin by selectively coupling the output pin to one of the first input pins, the second input pins and the reference input pin;
selectively coupling at least one of the second input pins and the reference input pin to the output pin during falling transitions of the pulsed output signal between two positive voltage levels, cyclically over a first period; and
selectively coupling at least one of the first input pins and the reference input pin to the output pin during rising transitions of the pulsed output signal between two negative voltage levels, cyclically over a second period.

7. The method of claim 6, wherein the first period and the second period is programmable.

8. The method of claim 6, wherein selectively coupling at least one of the second input pins and the reference input pin to the output pin further comprises:
cyclically over a third period sensing a second current flowing between the output pin and the second input pin currently coupled thereto;
decoupling the output pin from the first input pins and the reference input pin in response to the sensed second current flowing between the output pin and the second input pin currently coupled thereto being higher than a first threshold value.

9. The method of claim 8 wherein selectively coupling at least one of the first input pins and the reference input pin to the output pin further comprises:
cyclically over a fourth period sensing a first current flowing between the output pin and the first input pin currently coupled thereto; and
decoupling the output pin from the second input pins and the reference input pin in response to the sensed first current flowing between the output pin and the first input pin currently coupled thereto being higher than a second threshold value.

10. The method of claim 9, wherein the third period is shorter than the first period and the fourth period is shorter than the second period.

11. The method of claim 10, wherein the third period and the fourth period are programmable.

12. The method of claim 11, further comprising:
adjusting the third period based on the sensed second current; and
adjusting the fourth period based on the sensed first current.

13. A device, comprising:
a reference voltage;
a first input;
an output;
a first switch coupled to the first input;
a first diode coupled between the first switch and the output;
a second input;
a second switch coupled to the second input;
a second diode coupled between the second switch and the output;
a first current sensor coupled to the first diode;
a second current sensor coupled to the second diode;
a clamping branch coupled between the output and ground;
a clamping signal;
a plurality of logic gates coupled between the first current sensor, the second current sensor, the clamping signal, and the clamping branch.

14. The device of claim 13, wherein the clamping signal is periodical.

15. The device of claim 14, wherein the plurality of logic gates includes a first AND gate coupled to the first current sensor and a second AND gate coupled to the second current sensor.

16. The device of claim 15, wherein the plurality of logic gates includes an OR gate, a plurality of inputs of the OR gate coupled to the first and second AND gates and the clamping signal.

17. The device of claim 16, wherein the clamping branch includes a third switch, an output of the OR gate being coupled to the third switch.

18. The device of claim 17 wherein:
the first AND gate and the first switch are configured to receive a first control signal;
the second AND gate and the second switch are configured to receive a second control signal.

19. The device of claim 18, wherein the first switch comprises P-channel MOS transistors and the second switch comprises N-channel MOS transistors.

* * * * *